US006665620B1

(12) United States Patent
Burns et al.

(10) Patent No.: US 6,665,620 B1
(45) Date of Patent: Dec. 16, 2003

(54) UTILITY METER HAVING PRIMARY AND SECONDARY COMMUNICATION CIRCUITS

(75) Inventors: Gordon R. Burns, West Lafayette, IN (US); Byron J. Slater, Lafayette, IN (US)

(73) Assignee: Siemens Transmission & Distribution, LLC, Wendell, NC (US)

( * ) Notice: Subject to any disclaimer, the term of this patent is extended or adjusted under 35 U.S.C. 154(b) by 0 days.

(21) Appl. No.: 09/362,018

(22) Filed: Jul. 27, 1999

Related U.S. Application Data

(60) Provisional application No. 60/097,962, filed on Aug. 26, 1998.

(51) Int. Cl.[7] .............................................. G01B 21/00
(52) U.S. Cl. .................. 702/62; 702/188; 379/106.01; 379/106.02; 379/106.03; 340/870.02; 340/870.03
(58) Field of Search ............................. 702/61–63, 122, 702/188; 705/63, 412; 340/870.01, 870.43; 379/106.01, 106.03, 106.04, 106.08, 106.11

(56) References Cited

U.S. PATENT DOCUMENTS

| 4,316,262 A | 2/1982 | Mizuta et al. ............... 364/900 |
| 4,335,447 A | 6/1982 | Jerrim ........................ 364/900 |
| 4,361,838 A | 11/1982 | Mizuta .................. 340/870.02 |
| 4,540,849 A | 9/1985 | Oliver ............................ 179/2 |
| 4,578,536 A | 3/1986 | Oliver et al. ................... 179/2 |
| 4,594,545 A | 6/1986 | Germer ....................... 324/103 |
| 4,697,182 A | 9/1987 | Swanson ................ 340/870.02 |
| 4,701,858 A | 10/1987 | Stokes et al. ................. 364/483 |
| 4,833,618 A | 5/1989 | Verma et al. ................ 364/483 |
| 4,856,054 A | 8/1989 | Smith .......................... 379/107 |
| 4,884,021 A | 11/1989 | Hammond et al. .......... 324/142 |
| 4,987,363 A | 1/1991 | Gibbs et al. ................. 324/142 |
| 4,999,575 A | 3/1991 | Germer ....................... 324/142 |
| 5,059,896 A | 10/1991 | Germer et al. .............. 324/142 |
| 5,216,357 A | 6/1993 | Coppola et al. ............. 324/142 |
| 5,454,024 A * | 9/1995 | Lebowitz ....................... 379/40 |
| 5,471,137 A | 11/1995 | Briese et al. .............. 324/158.1 |
| 5,473,322 A | 12/1995 | Carney .................. 340/870.02 |
| 5,544,089 A | 8/1996 | Hemminger et al. ........ 364/492 |
| 5,627,759 A | 5/1997 | Bearden et al. ............. 364/483 |
| 5,682,422 A | 10/1997 | Oliver ......................... 379/107 |
| 5,699,276 A * | 12/1997 | Roos ....................... 364/514 A |
| 5,767,790 A | 6/1998 | Jovellana ................ 340/870.02 |
| 6,295,449 B1 * | 9/2001 | Westerlage et al. .......... 455/422 |

* cited by examiner

*Primary Examiner*—Marc S. Hoff
*Assistant Examiner*—Sam H. Choi
(74) *Attorney, Agent, or Firm*—Maginot, Moore & Beck (57) ABSTRACT

A communication system for a utility meter that has a primary power supply includes a primary communication circuit and a secondary communication circuit. The primary power supply is operable to receive a primary electrical power from a primary power source and generate a primary bias power therefrom. The primary communication circuit is operable to effectuate external communications when the primary electrical power from the primary power source is present. The secondary communication circuit is operable to effectuate external communications when the primary electrical power from the primary power source is interrupted.

26 Claims, 5 Drawing Sheets

UTILITY METER HAVING PRIMARY AND SECONDARY COMMUNICATION CIRCUITS

This application claims the benefit of U.S. Provisional Application Ser. No. 60/097,962, filed Aug. 26, 1998. The disclosure of U.S. Provisional Application Ser. No. 60/097,962 is hereby incorporated by reference.

CROSS REFERENCE

Cross reference is made to copending U.S. patent application Ser. No. 09/361,606, filed Jul. 27, 1999, entitled "Secondary Power Supply for Utility Meter", which is assigned to the same assignee as the present invention.

Also, cross reference is made to copending U.S. patent application Ser. No. 09/361,605, filed Jul. 27, 1999, entitled "Power Supply for Electronic Utility Meter Using Optical Isolation", which is assigned to the same assignee as the present invention.

FIELD OF THE INVENTION

The present invention relates generally to utility meters, and more particularly, utility meters having communication circuits.

BACKGROUND OF THE INVENTION

Utility meters are devices that, among other things, measure the consumption of a utility generated commodity, such as electric energy, gas, or water, by a residence, factory, commercial establishment or other such facility. Utility service providers employ utility meters to track customer usage of utility generated commodities. Utilities track customer usage for many purposes, including billing and tracking demand for the relevant consumed commodity.

Increasingly, meters employ electronic circuits to both reduce the number of moving parts in the meters and to provide enhanced metering and data collection services. In addition, meters have increasingly employed communication circuits to facilitate remote meter reading. Specifically, a utility meter is typically installed at or near the facility or residence of each customer. Service providers historically have used field technicians or "meter-readers" to obtain usage data from the remotely located utility meters. Manual meter reading, however, imposes significant labor costs and is vulnerable to transportation problems and human error. Consequently, utility meters have been increasingly outfitted with communication circuits to facilitate remote meter reading.

One type of utility meter, the electrical utility meter, includes electronic circuits that automatically generate and store electrical energy consumption information. The electrical utility meter may also include circuits that communicate the electrical energy consumption information to a remote device to achieve the aforementioned remote meter reading operation. The remote device may be part of a centralized data processing arrangement that collects energy consumption information from a multitude of meters via one or more of various hard-wired and/or wireless communication networks such as, for example, telephone networks and radio networks. Such arrangements can significantly reduce (or eliminate) the need for manual meter reading of large numbers of meters located over wide areas.

In general, electrical utility meters having such communication capabilities may be divided into three parts: a sensor part, a measurement part, and a communication interface. The sensor part includes primarily analog circuitry in the form of sensor devices that are connected to the electrical system of a facility, and more particularly, to the power lines. The sensor devices generate energy consumption signals that are indicative of the voltage and current in the power lines. The measurement part includes primarily digital circuitry that receives and processes the energy consumption signals generated by the sensor part. As a result, the measurement part generates metering data representing, for example: watt-hours, volt-amps ("VAs"), reactive volt-amps ("VARs") and other information that quantifies the power consumed by the facility.

The communication interface includes digital and/or analog circuits for transmitting the metering data and/or diagnostic data to a remote device. The communication interface may also receive commands from a remote device regarding desired transmissions and/or operating modes. The communication circuits of meters that communicate with a centralized data processing system typically employ digital modems. Digital modems are capable of relatively high data rates, and may be used to effectuate communication over a public switched telephone network ("PSTN"). Accordingly, meters employ digital modems to allow a substantial number of meters to communicate information to a central location in any given time period.

One drawback to the use of digital modems in meters arises in the operation of the meter during a power outage. The electronic circuitry within the meter requires bias power to operate. The bias power is often provided by a power supply within the meter, which derives its power from the AC power lines. In the event of an AC power interruption (including but not limited to any situation in which the AC electrical power received from the power lines is greatly reduced or completely absent, whether by design or by accident) the circuitry within the meter loses the bias power derived from the AC electrical power. If all of the bias power to the circuitry is lost, then the circuitry cannot perform metering and reporting functions. Consequently, a secondary power source (for example, a battery) is typically employed to enable the meter to perform certain metering and reporting operations during a power outage.

The drawback of using digital modems for meter communications is that the operation of a digital modem generally consumes a substantial amount of power. As a result, if a power interruption occurs and such a meter is operating from a battery or super-capacitor back-up power source, the operation of the modem may consume the back-up power source at an undesirably rapid rate. Such rapid power source consumption can leave little or no back-up power available for sustaining other desired operations of the meter (such as, for example, time keeping operations) during an interruption in the primary power. Also, where a battery is used as the back-up or secondary power source, the high power consumption hastens the inevitable inconveniences of servicing and/or replacing the expended battery.

Accordingly, there is a need to reduce the high power demand that an electrical meter's communications operations make on the meter's secondary power source when the primary electrical power to the meter is interrupted.

SUMMARY OF THE INVENTION

The present invention fulfills the above need, as well as others, by providing a communication system for a utility meter that includes primary and secondary communication circuits, where the secondary communication circuit is employed during power interruptions and the primary communication circuit is employed during normal circumstances. The primary communication circuit preferably provides relatively high speed communication functionality under normal circumstances (i.e. when there is no interruption of primary electrical power to the meter). By contrast, the secondary communication circuit, which preferably consumes less power and may have a lower data rate, is employed in the event of an interruption in the primary electrical power. Because little data need be transmitted in the event of a power interruption, the reduced data rate of the secondary communication circuit is sufficient. Advantageously, such a low data rate is readily accomplished using a low power circuit.

In accordance with one embodiment of the present invention, a communication system for a utility meter is provided, wherein the utility meter includes a primary power supply operable to receive a primary electrical power from a primary power source and generate a primary bias power therefrom. The communication system includes a primary communication circuit operable to effectuate external communications when said primary electrical power from the primary power source is present. The communication system further includes a secondary communication circuit operable to effectuate external communications when said primary electrical power from the primary power source is interrupted.

In accordance with another embodiment of the present invention, a utility meter having a communication system is provided. The utility meter includes a source of commodity consumption signals. The utility meter further includes a measurement circuit operable to generate metering data from the commodity consumption signals. The utility meter also includes a primary power supply operable to receive a primary electrical power from a primary power source and generate a primary bias power therefrom. Furthermore, the utility meter includes a primary communication circuit operable to effectuate external communications when said primary electrical power from the primary power source is present. The utility meter also includes a secondary communication circuit operable to effectuate external communications when said primary electrical power from the primary power source is interrupted.

In accordance with another embodiment of the present invention, a power interruption communication method for a utility meter is disclosed, wherein the utility meter includes a primary communication circuit for effecting external communication, the primary communication circuit operably connected to receive primary bias power from a primary power supply, the primary power supply having an arrangement for obtaining a primary electrical power from a primary power source. The power disturbance communication method includes detecting an interruption in the primary electrical power from the primary power source. The power disturbance communication method further includes reducing an amount of operation of the primary communication circuit when the primary electrical power from the primary power source is interrupted. The power disturbance communication method further includes increasing an amount of operation of the secondary communication circuit when the primary electrical power from the primary power source is interrupted.

By utilizing the secondary communication circuit to effectuate communications between the meter and the remote device when the primary electrical power to the meter from the primary power source is interrupted, the demands placed on whatever secondary power source the meter employs are reduced.

The above discussed features and advantages, as well as others, may be readily ascertained by those of ordinary skill in the art by reference to the following detailed description and accompanying drawings.

DETAILED DESCRIPTION

Figure 1:
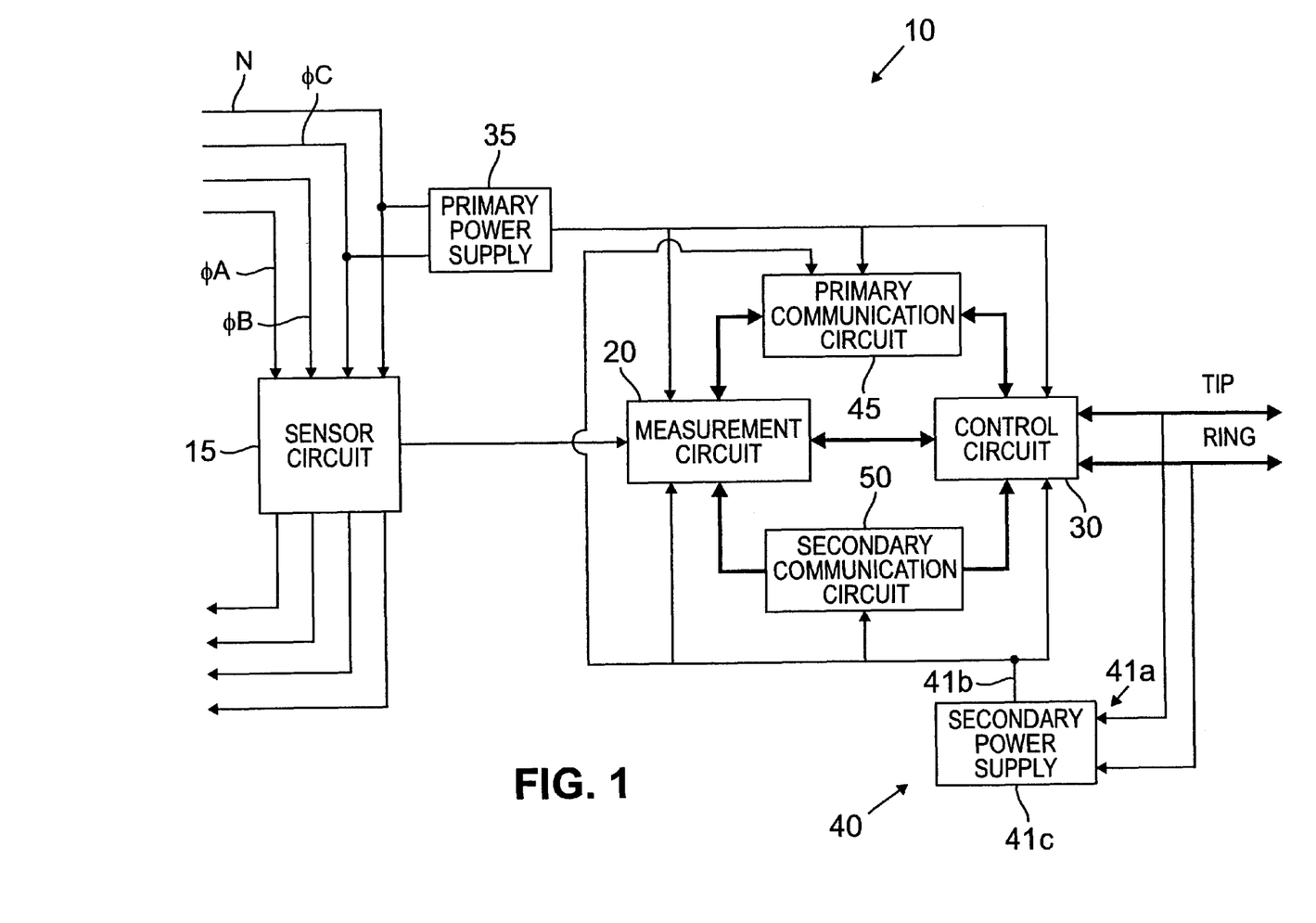
FIG. 1 shows a block diagram of an exemplary electronic utility meter according to the present invention.

FIG. 1 shows a block diagram of an exemplary electronic utility meter 10 according to the present invention. In general, the meter 10 includes a sensor portion or sensor circuit 15, a primary power supply 35, a measurement portion or measurement circuit 20, a control circuit 30, a primary communication circuit 45, a secondary communication circuit 50, and a secondary power supply 40. As discussed in further detail below, the electronic utility meter 10 has a communication system which uses the secondary communication circuit 50 in lieu of the primary communication circuit 45 when the AC electrical power to the meter 10 is interrupted.

The sensor circuit 15 is operably coupled to a plurality of utility power lines including a phase A power line φA, a phase B power line φB, a phase C power line φC, and a neutral line N. The plurality of utility power lines φA, φB, φC, and N connect to an electrical utility, not shown, and provide power from the utility to a load, not shown, for which power consumption is metered by the meter 10. The load may suitably be the electrical system of a residential facility, industrial facility, commercial facility, or the like. It is noted that the exemplary embodiment described herein is installed in what is referred to as a three phase power configuration, consisting of three phases of power lines φA, φB, and φC. The present invention, however, is in no way limited to use in any particular power configuration, and those of ordinary skill in the art may readily modify the meter 10 for use in single phase and other power configurations.

The sensor circuit 15 includes circuitry for generating energy consumption signals indicative of the power provided to the load on the power lines φA, φB, φC, and N. To this end, the sensor circuit 15 may include a plurality of current sensing devices, such as current transformers, current shunts, embedded coils or the like, which generate energy consumption signals such as IA, IB, and IC that are representative of the current waveform on each of the lines φA, φB, and φC. Likewise, the sensor circuit 15 may further include a plurality of voltage sensing devices, such as voltage divider circuits, which generate further energy consumption signals such as VA, VB, and VC that are representative of the voltage waveform on each of the lines φA, φB, and φC.

The sensor circuit 15 is operably connected to provide the energy consumption signals to the measurement circuit 20. The measurement circuit 20 is a device or circuit that is operable to generate metering data from the energy consumption signals. Metering data may include, among other things, a number representative of accumulated energy consumption in the form of watt-hrs, VA-hrs, or VAR-hrs. The metering data may be used by the utility for, among other things, billing and demand tracking purposes.

To this end, the measurement circuit 20 may include one or more processors and associated circuitry. Such measurement circuits for use in utility meters are well known. An exemplary embodiment of a suitable measurement circuit that may be used as the measurement circuit 20 is discussed below in connection with FIG. 2. The measurement circuit 20 is preferably coupled to a display, not shown, that is operable to display metering information. The structure and operation of such displays would be known to those of ordinary skill in the art.

The primary power supply 35 is a circuit that obtains primary electrical power from a primary power source and generates primary bias power for the meter 10. In the embodiment described herein, the primary power supply 35 may suitably be connected to power line $\phi C$ to obtain primary electrical power therefrom. The primary power supply 35 provides the primary bias power to one or more digital circuits within the meter 10, such as, for example, the primary communication circuit 45, the measurement circuit 20, and/or the control circuit 30. Such circuits are well known. An exemplary primary power supply that may be used as the primary power supply 35 is described below in connection with FIG. 2.

It will be noted that in the alternative, the primary power supply 35 may suitably be connected to receive primary electrical power from other power lines, all of the power lines or alternative power sources.

In any event, when primary electrical power is interrupted, the primary power supply 35 cannot generally produce the primary bias power. For example, an interruption in primary electrical power in the disclosed example is a power outage in which the power line $\phi C$ fails to provide electrical power. Because the primary power supply 35 does not receive the primary electrical power during such an interruption, the primary power supply 35 cannot produce the primary bias power. As will be discussed more fully below in connection with FIG. 2, the primary power supply 35 may nevertheless be able to provide temporary bias power during the discharge of energy storage devices within the power supply, such as capacitors. However, such temporary bias power is short-lived.

The primary communication circuit 45 is a device that is operable to effectuate external communications. In the embodiment described herein, the primary communication circuit 45 is operable to communicate over an external communication network line TIP and RING through the control circuit 30. The external communication circuit is preferably a land-based communication system that maintains an ambient power level on the lines TIP and RING, such as a telephone network. However, it will be noted that in alternative embodiments, the primary communication circuit 45 may suitably include devices that communicate using radio frequency transmissions.

The primary communication circuit 45 is operable to communicate metering and/or diagnostic information generated within the meter 10 to a remotely located central computer, not shown. Because the meter 10 may be one of several thousand meters connected to the remotely located central computer, the primary communication circuit 45 preferably includes a relatively high speed digital modem, such as any commercially available V0.32bis standard, 14,400 baud modem. The use of a high speed digital modem advantageously reduces the amount of time required by the primary communication circuit 45 to communicate the metering and/or diagnostic information to the central computer.

Preferably the primary communication circuit 45 is connected to obtain the primary bias power from the primary power supply 35. Accordingly, the primary communication circuit 45 is operable to effectuate such external communications when the primary electrical power (i.e. power on the $\phi C$ power line) is present.

The secondary power supply 40 is a device that is operable to provide the second bias power to at least one operational circuit of the meter 10 when primary electrical power is interrupted. In accordance with one aspect of the invention, the secondary power supply 40 has a secondary power input 41a that is operably coupled to the external communication network to receive electrical power therefrom. In particular, many communication networks, including the publicly-switched telephone network, provide an ambient voltage level to connected communication devices. In accordance with one aspect of the invention, the secondary power supply 40 includes a power converter circuit 41c that is operable to obtain power from the ambient voltage level on the communication network lines TIP and RING and generate secondary bias power therefrom.

The secondary power supply 40 has an output 41b that may suitably provide secondary bias power to one or more parts of the measurement circuit 20, the secondary communication circuit 50, and/or the control circuit 30. Specifically, the secondary power supply 40 is operable to provide power to one or more of such circuits that perform one or more operations while the primary electrical power is interrupted. Exemplary embodiments of the secondary power supply 40 are discussed below in connection with FIG. 2.

One advantage of the present invention arises from the connection of the secondary power supply 40 to the communication network. Because secondary power is derived from an external network, many of the shortcomings of the prior art secondary power supplies in utility meters are overcome. Prior art secondary power supplies, which typically employed battery power, were subject to failure from battery discharge, especially over lengthy power interruptions or power outages. In such cases, critical functions of the measurement circuits or control circuits of the meter would fail. However, the secondary power supply 40 of the present invention employs a source of electrical power that is, for practical purposes, non-discharging. As will be discussed further below, it may still be advantageous to employ a battery in the secondary power supply 40. Nevertheless, the use of the electrical power from the external communication network according to the present invention enables recharging of the battery while the primary electrical power is still interrupted.

In accordance with another aspect of the present invention, the secondary power supply 10 preferably includes optical isolation to electrically isolate the external communication network lines TIP and RING from the circuitry of the meter 10. An exemplary embodiment of such an optically isolated secondary power supply is discussed further below in connection with FIG. 4. The use of optical isolation advantageously achieves a large degree of isolation, as is typically required when obtaining electrical power from an external source, without introducing bulky and expensive magnetics associated with traditional transformer-based power supplies.

Referring again to FIG. 1, the secondary communication circuit 50 is a circuit that is operable to effectuate external communications when the primary electrical power is interrupted. In other words, if the power supply 35 can no longer produce primary bias power, the secondary communication circuit 50 is operable to effectuate external communications. To this end, the secondary communication circuit 50 may suitably be connected to the secondary power supply. In the embodiment described herein, the secondary communication circuit 50 effectuates such communications over the external communication network lines TIP and RING through the control circuit 30.

In the preferred embodiment, the secondary communication circuit 50 is configured to consume less power than the primary communication circuit 45 when effectuating external communications. To achieve the lower power consumption economically, the secondary communication circuit 50 is typically of a design that is capable of a much slower data rate than the primary communication circuit 45. Communication circuits that consume less power than relatively high speed digital modems while being capable of slower data rates are well known. For example, as discussed below in connection with FIG. 2, the secondary communication circuit may suitably be a dual tone, multiple frequency (DTMF) communication circuit, which requires less operating power than a digital modem.

Accordingly, when primary electrical power is interrupted, the use of the secondary power supply can reduce energy consumption of the meter while still providing some level of remote communication capability.

The control circuit 30 is a circuit that includes one or more processors and other devices that control various aspects of the communication operations of the meter. Namely, the control circuit 30 operates to enable communications between the primary communication circuit 45 the external communication network lines TIP and RING when primary electrical power is present and between the secondary communication circuit 50 and the external communication network lines TIP and RING when the primary electrical power is interrupted. To this end, the control circuit 30 is operable to obtain information identifying an interruption of the primary electrical power and enable operation of the secondary communication circuit responsive to said information. An example of such a circuit is described below in connection with FIG. 2.

The control circuit 30 may further control other circuits of the meter 10, including portions of the measurement circuit 20. Moreover, the control circuit 30 may suitably share elements with the measurement circuit 20, such as processors and the like, which are generally capable of performing more than one particular function.

In operation, when primary electrical power is present (i.e. power is present on the power line φC) the meter 10 performs normal metering functions, or in other words, measures a quantity of consumed electrical energy that is conveyed through the power lines φA, φB and φC. To this end, the sensor circuit 15 generates energy consumption signals and provides the energy consumption signals to the measurement circuit 20. The measurement circuit 20 obtains the energy consumption signals and generates metering information therefrom. The metering information, which may for example, include information representative of a quantity of consumed energy in kilowatt-hrs, may then be stored and/or provided to the display, not shown.

In addition, from time to time, the measurement circuit 20 and/or the control circuit 30 may perform internal diagnostic tests. Such diagnostic tests may include diagnostics that determine whether the components of the measurement circuit 20 and/or control circuit 30 are operating properly. Suitable diagnostic tests for the processors and related circuitry of the measurement circuit and control circuit 30 are well known, and will vary as a matter of design choice. The results of such diagnostic tests, similar to the metering information, may suitably be stored and/or displayed.

During normal operations, the primary communication circuit 45 periodically communicates metering information, diagnostic test results, or both, to the remotely located central computer. In some cases, the primary communication circuit 45 may communicate such information to a plurality of remote locations. In any event, to this end, the primary communication circuit 45 receives the metering information or diagnostic test results from the measurement circuit 20 and communicates such information to the external communication network lines TIP and RING through the control circuit 30.

To this end, the control circuit 30 ensures that the primary communication circuit 45 is operably coupled to the external communication network lines TIP and RING. As discussed further below in connection with FIG. 2, the control circuit 30 may include some of the interface or driver circuitry that modulates the modem output signals onto the telephone line.

The meter 10 operates in such a manner as long a primary electrical power is present, or in other words, the power lines φA, φB, φC are providing electrical power to both the facility being metered and to the meter 10 itself. If power is interrupted, it is noted that the meter 10 typically need no longer generate energy consumption measurements because no power is available on the power lines φA, φB, φC to be consumed. However, as discussed above, during a power outage, at least some of the circuitry within the meter 10 performs operations that require secondary bias power. Such operational circuits may include, but are not limited to, clock, memory, or communication circuits.

For example, it is useful to track time or duration of a power outage within the measurement circuit 20 and/or control circuit 30. In particular, time-of-use meters, as are known in the art, track energy usage and the time of day, and thus require a running, real-time clock. To ensure accuracy of the real-time clock after a power interruption, one or more components in the measurement circuit 20 and/or control circuit 30 operate a reference clock during the power interruption. Such a clock requires secondary bias power during a power interruption. An example of such a reference clock is discussed below in connection with FIG. 5.

In addition, it is often advantageous to effectuate external communications during a power interruptions. In particular, it may be useful to communicate basic metering quantities or diagnostic information during a power interruption to either the remotely located central computer or to some other site. Perhaps more importantly, it is useful for the meter 10 to communicate the mere existence of the power interruption and the identification of the meter 10 in order to facilitate remedial and/or analytical action.

There may be, of course, other potential operations, such as data retention in dynamic memory, that require secondary bias power during a power interruption. The operations requiring such secondary bias power obtain such power from the secondary power supply 40, as discussed further below.

Referring again to the specific operation of the meter 10, in the event of a power interruption, the power lines φA, φB, and φC stop conveying electrical power. Because the electrical power on the power line φC is interrupted, the primary power supply 35 can no longer provide bias power to the various elements of the meter 10. As noted above, the primary power supply 35 may provide temporary bias power as elements located therein discharge, thereby enabling continued operation of various circuits for a short time after the power interruption. However, in a short time, typically less than a few seconds, the primary power supply 35 no longer generates primary bias power.

The control circuit 30 then obtains information identifying the interruption of primary electrical power. Responsive to obtaining such information, the control circuit causes the secondary communication circuit 50 to be connected to the external communication network lines TIP and RING. Somewhat contemporaneously, the secondary power supply 40 begins providing secondary bias power to select elements of the meter 10. The secondary bias power allows the measurement circuit 20 and/or the control circuit 30 to maintain critical operations, such as time keeping and data retention, while the primary electrical power is interrupted. Because the secondary power supply 40 receives the secondary electrical power from the external communication network, it may continue to provide secondary bias power regardless of the duration of the power interruption. Further detail regarding the operational parameters of the secondary power supply 40 are provided further below.

Preferably, the secondary communication circuit 50 thereafter effectuates external communications which notifies a remote facility, not shown, of the power interruption. The secondary communication circuit 50 may also provide certain metering information and or diagnostic test results to the remotely located central computer. The secondary communication circuit 50, which, as discussed above, consumes less power for operation, does not tax the secondary power supply 40 to the extent that the primary communication circuit 45 would.

It will be noted that the above described embodiment includes several independently useful and novel concepts. Thus, alternative implementations that employ only one of such concepts can benefit from many of the advantages of that particular concept. For example, the advantages provided by the secondary power supply 40 obtaining secondary electrical power from an external communication circuit are still applicable in a device that does not necessarily include the secondary communication circuit 50. In particular, several meters have critical functions (other than communications) that require power during a power interruption. The secondary power supply 40 of the present invention provides such power, without the drawbacks of using only a battery or capacitor, by obtaining secondary electrical power from the external communication network.

Moreover, the advantages of the communication circuit arrangement of the present invention remain even if a prior art secondary power supply is used. For example, it is still advantageous to employ a relatively low power communication circuit during a power interruption to conserve the secondary electrical power even when the secondary power source is only a battery. The use of the low power communication circuit would advantageously reduce the drain on the battery.

Figure 2:
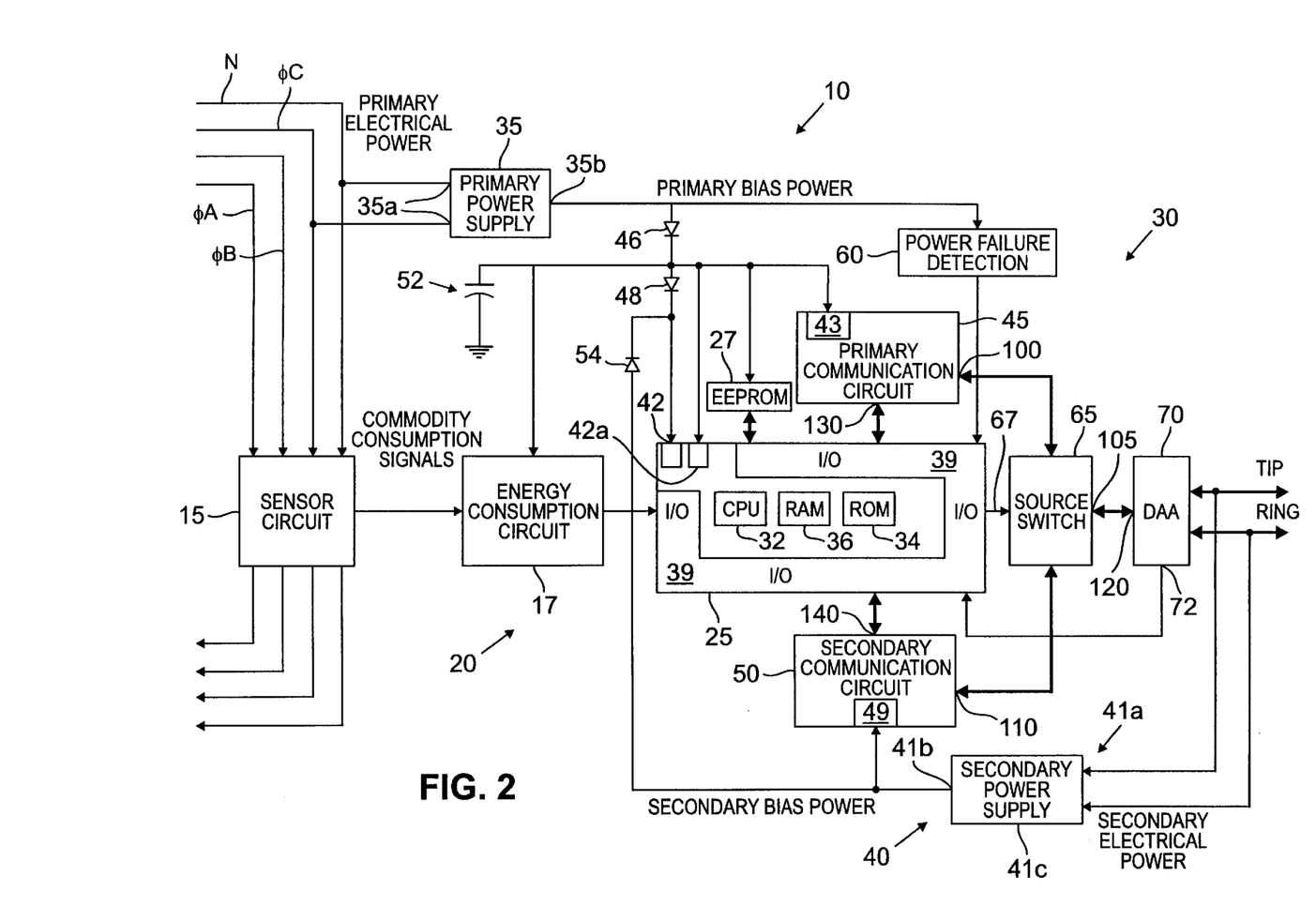
FIG. 2 shows a detailed block diagram of an exemplary embodiment of the meter of FIG. 1.

FIG. 2 shows a more detailed block diagram of one exemplary embodiment of the meter 10 of FIG. 1. Like reference numbers are used to identify like components. However, it will be noted that the detailed embodiments in FIG. 2 of each of the functional blocks of FIG. 1 are given by way of example only.

Referring to FIG. 2, the primary power supply 35 is a circuit that is operable to convert AC electrical power received from an external power source, which in the exemplary embodiment is the phase C power line φC, to a bias voltage, preferably a DC bias voltage. In particular, the primary power supply 35 may suitably be a switched-mode inverter type power supply that converts the primary electrical power from the AC power line φC received at its input 35a, to one or more DC bias voltages provided at its output 35b. To this end, the input 35a is coupled across the phase C power line φC and the neutral line N.

A storage capacitor 52 is coupled between the output of the first protection diode 46 and ground. The storage capacitor 52 is operable to store energy generated by the primary power supply 35 during normal operation, or in other words, in the absence of an interruption in the primary electrical power. The storage capacitor 52 is further operable to use the stored energy to provide short-term power to the measurement circuit 20, control circuit 30 and/or the primary communication circuit 45 upon an interruption in the primary electrical power. The storage capacitor 52 thereby allows short-term high power consumption immediately following an interruption in the primary electrical power.

As discussed above in connection with FIG. 1, the measurement circuit 20 in the embodiment of FIG. 2, is a circuit that is operable to receive the energy consumption signals representative of the power on the power lines φA, φB, and φC and generate metering data therefrom. In the embodiment of FIG. 2, the measurement circuit 20 includes an energy consumption circuit 17, a processor 25, and a nonvolatile memory 27.

The energy consumption circuit 17 is a circuit that is operably coupled to the sensor circuit 15 to receive the analog energy consumption signals therefrom. The energy consumption circuit 17 is also operably coupled to the processor 25 to provide energy consumption data 18 thereto. The phrase "energy consumption data" as used herein is data that includes information regarding the energy flowing through the lines φA, φB, and φC, and may by way of example consist of digital words representative of values of watts, VA, VAR, watt-hrs, VA-hrs, VAR-hrs, or even constituent values such as Vrms, Irms or power factor information. Such circuits may be integrated into a single integrated circuit package. An example of such a circuit includes the Power Measurement Integrated Circuit found with the Model S-4 Meter available from Siemens Power Transmission & Distribution, LLC, in Lafayette IN. Other examples of such circuits include the digital multiplication and DSP circuit 20 of U.S. Pat. No. 4,884,021 to Hammond, the digital signal processor 14 of U.S. Pat. No. 5,059,896, the front end CPU 44 of U.S. Pat. No. 5,471,137 to Briese et al., and the A/D and DSP 14 of U.S. Pat. No. 5,544,089 to Hemminger et al., all of which are incorporated herein by reference.

Referring again to FIG. 2, the processor 25 is preferably a microprocessor or microcontroller, that includes a central processing unit ("CPU") 32, a read only memory ("ROM") 34, a random access memory ("RAM") 36, and various input/output ports ("I/O") 39. The processor 25 is configured in a manner well known in the art to obtain energy consumption data and generate metering information therefrom. To this end, the CPU 32, which preferably executes a program stored in the ROM 34, controls the operation of the various devices of the processor 25.

In particular, the CPU 32 receives energy consumption data from the energy consumption circuit 17 through the I/O 39. The CPU 32 then uses the RAM 36 and/or registers internal and external to the CPU 32 to store various values, including interim calculations, in order to carry out processes that generate the metering information. The resulting metering information may include, by way of example, accumulated energy consumption data as well as quantities associated with demand metering and time of use metering. Examples of processors that obtain energy consumption information and perform further operations on such data to generate metering information as well as perform other functions are described in U.S. Pat. Nos. 4,884,021, 5,059,896, 5,471,137 and 5,544,089, discussed above.

Also, in the exemplary embodiment described herein, the processor 25 includes first and second bias connections 42 and 42a. The first and second bias connections 42 and 42a are pin connections to the processor 25. The first bias connection 42 is operably coupled to receive primary bias power from the primary power supply 35 through first and second protection diodes 46 and 48, respectively. In addition, the bias connection 42 is operably coupled to receive secondary bias power from the secondary power supply 40 through the third protection diode 54. By contrast, the second bias connection 42a is only connected to receive primary bias power from the primary power supply 30 through the first connection diode 46. In this manner, only select portions of the processor 25 will receive bias power during a power interruption, thereby reducing the load on the secondary power supply 40. An exemplary processor that provides first and second bias connections that may be so configured for full power and low power operation is a series 78064 microcontroller available from NEC.

Alternatively, it will be noted that a processor having only a single bias connection may be used, wherein the single bias connection is connected to receive both primary bias power and secondary bias power by being connected to the junction of the second protection diode 48 and the third protection diode 54.

The non-volatile memory 27 is operably connected to the I/O 39 of the processor 25. In the exemplary embodiment described herein, the non-volatile memory 27 may suitably be an electrically erasable programmable read only memory ("EEPROM"). The connection and operation of such devices are well known.

As discussed above in connection with FIG. 1, the control circuit 30, in general, is a circuit that is operable to control various operations of the meter 10 in accordance with the present invention. To this end, the control circuit 30 is operable to carry out the control logic shown in FIGS. 5A and 5B. In the exemplary embodiment described herein, the control circuit 30 includes the processor 25, described above (which, in the exemplary embodiment described herein, is also part of the measurement circuit 20), the power failure detection circuit 60, a source switch 65, and a data access arrangement circuit ("DAA") 70.

In accordance with the present invention, the processor 25 is operably configured to, through suitable programming and/or physical configuration, determine whether the power supply 35 is not receiving electrical power from the external power source. To this end, the I/O 39 is coupled to receive a power failure signal from the power failure detection circuit 60. The processor 25 is operable to determine whether the power supply 35 is not receiving electrical power from the external power source based on the power failure signal.

In response to a determination that the power supply 35 is not receiving electrical power, the processor 25 is operable to effectuate communications between the secondary communication circuit 50 and the external communication network lines TIP and RING through the DAA 70.

It is noted that the embodiment of the control circuit 30 in FIG. 2 is given by way of example only, and that other embodiments exist, including embodiments in which the control circuit 30 employs a different processor than the measurement circuit 20. Alternatively, the control circuit 30 may employ a state machine and/or discrete digital circuitry to carry out the above described operations instead of, or in addition to, the processor 25.

The primary communication circuit 45 in the exemplary embodiment described herein is a high speed digital communication device, for example, a 14,400 baud modem. The primary communication circuit 45 includes a bus port 130 and a communication port 100. The bus port 130 is operably coupled to the processor 25 and the communication port 100 is operably connected to the source switch 65. The primary communication circuit 45 also includes a bias connection 43 that is operably coupled to the primary bias power supply output 35b through the first protection diode 46.

In the exemplary embodiment described herein, the primary communication circuit 45 is a digital modem integrated circuit which is operable to facilitate relatively high speed communications between the processor 25 and the remotely located central computer, not shown, via the TIP and RING lines of a PSTN, not shown. In particular, the primary communication circuit is operable to receive digital data from the processor 25 through the bus port 130, which may include metering information and/or diagnostic test results, and generate digital communication signals therefrom at its communication port 100.

It will be appreciated that the primary communication circuit 45 described herein is merely exemplary, and that those of ordinary skill in the art may readily devise other suitable implementations. For example, a separate communication microprocessor or microcontroller could be incorporated into the primary communication circuit 45 to reduce the computational burden on the processor 25. Moreover, those of ordinary skill in the art may readily substitute other circuits that communicate data between the processor 25 and a remote device. Such devices are well known and may include wireless transmission media, optical fiber transmission media, and the like.

As discussed above in connection with FIG. 1, the secondary communication circuit 50 is preferably operable to effect relatively low power consumption communications between the meter 10 and a remote device. To this end, the secondary communication circuit 50 includes a bus port 140 coupled to the processor 25 and a communication port 110 coupled to the source switch 65. Further, a bias connection 49 of the secondary communication circuit 50 is operably coupled to the secondary bias power supply output 41. In the exemplary embodiment, the secondary communication circuit may suitably be a dual-tone multiple frequency ("DTMF") modem chip. Commercially available DTMF modem chips use significantly less power than high speed digital modems, but typically are not capable of the same data rate. The details of the configuration and operation of such DTMF modem chips would be readily ascertainable by one of ordinary skill in the art.

It will be appreciated that the secondary communication circuit 50 described herein is merely exemplary, and that those of ordinary skill in the art may readily devise other suitable ways to implement such a circuit. Specifically, other communication circuits that require less operating power, with possible sacrifices in communication data rate, may be substituted for the DTMF modem chip.

The power failure detection circuit 60 is a device that generates a power failure signal that is representative of whether the AC electrical power to the power supply 35 has been interrupted. In the exemplary embodiment described herein, the power failure detection circuit 60 is connected to the power supply output 35b and to I/O 39 of the processor 25. Further details regarding an exemplary embodiment of the power failure detection circuit 60 are provided below in connection with FIG. 3.

The source switch 65 is a device that is coupled to the communication ports 100, 110 of the primary and secondary communication ports 45, 50 respectively. The source switch 65 includes a data port 105 and is operable to, in response to a switch control signal 67 from the processor 25, alternatively couple the communication port 100 of the primary communication circuit 45 and the communication port 110 of the secondary communication circuit 50 to the data ports 105. The data port 105 is, in turn, coupled to the data port 120 of the DAA 70. In the exemplary embodiment described herein, the source switch 65 may suitably be a multiple-pole double-throw type solid state analog mux such as a model ADG711 analog mux available from Analog Devices. In any event, the source switch 65 may be implemented and operated in a number of alternative ways which would be well known to those of ordinary skill in the art.

The DAA 70 is a device that effectively converts signals between the signal format of the external communication network and the signal format of the first and second communication circuits 45, 50, respectively. In the exemplary embodiment described herein, the DAA 70 is capable of converting the output signals of the digital modem of the first communication circuit 45 to suitable analog signals for transport over the lines TIP and RING. The DAA 70 is also capable of effectively passing through DTMF signals generated by the secondary communication circuit 50.

In addition, the DAA 70 preferably includes a telephone circuit that performs ring detection, isolation, hook switch, and other telephony functions. The DAA furthermore includes a data port 72 through which it may communicate status and control information with the processor 25. For example, the DAA 70 provides data at the data port 72 indicating whether the TIP and RING line are in an on-hook or off-hook condition. Suitable DAA circuitry having the structure and operation described above is widely available. An example of a suitable DAA circuit includes the CYBER-GATE CYG2021 integrated circuit available from CP Clare Corp. of Arlington Heights, Ill.

As discussed above, the secondary power supply 40 is a circuit that includes an input 41a, an output 41b, and a power converter 41c. The input 41a is operably coupled obtain secondary electrical power from the external communication network through the lines TIP and RING. The power converter 41c is operable to convert the secondary electrical power into secondary bias power. In the exemplary embodiment, the secondary power supply 40 provides the secondary bias power, for example 5 volt DC bias power at its output 41c. An exemplary secondary power supply 40 is discussed below in connection with FIG. 4.

In accordance with another aspect of the present invention, the secondary power supply 40 employs optical isolation to isolate the secondary power source (i.e. the TIP and RING lines) from the meter 10. Further details regarding such an embodiment of the secondary power supply 40 are provided below in connection with FIG. 4. The output 41 is operably coupled to the third protection diode 54.

The third protection diode 54 is further coupled to the output of the second protection diode 48 and to the first bias connection 42 of the processor 25. Thus, through the third protection diode 54, the secondary power supply 40 is operable to provide the secondary bias power to the processor 25 during an interruption in the primary electrical power. However, the second protection diode 48 prevents the secondary bias power from reaching the storage capacitor 52, the non-volatile memory 27, and the energy consumption circuit 17. As a result, those circuits and/or devices do not consume secondary bias power, thereby conserving power while the secondary power supply 40 is in operation.

In the operation of the meter 10 of FIG. 2 during normal metering operations, AC electrical power is provided from the electrical utility, not shown, to the load, not shown, through the power lines φA, φB, φC, and N. In general, AC electrical power is often provided in three phases to large industrial and commercial establishments. In any event, the power provided to the load is detected by the sensor circuit 15, which generates energy consumption signals indicative of such power flow. The sensor circuit 15 provides the energy consumption signals to the energy consumption circuit 17. In the preferred embodiment described herein, the sensor circuit 15 generates the three voltage measurement signals VA, VB, and VC and the three current measurement signals IA, IB, and IC. Each of the three voltage measurement signals is an analog signal that is representative of the voltage waveform on one of the power lines. Each of the three current measurement signals is an analog signal that is representative of the current waveform on one of the power lines.

The energy consumption circuit 17 generates energy consumption data or metering data based on the energy consumption signals. For example, the energy consumption circuit 17 may generate digital data signals that include energy consumption information relating to watts, VAs, VARs, watt-hrs, VA-hrs, VAR-hr, or component signals thereof. The energy consumption circuit 17 provides the energy consumption data to the processor 25 through the I/O 39. The processor 25 then performs a number of functions using the energy consumption data in order to generate metering information.

Metering information may include accumulated energy consumption information in standardized units, time of use metering information, demand metering information, and other information typically generated in electronic meters. For example, in the preferred embodiment, the processor 25, and in particular, the CPU 32, accumulates energy consumption in standard units for one or more of watt-hrs, VA-hrs, and VAR-hrs. The metering information is stored locally in the RAM 36, or alternatively, in registers internal to the CPU 32.

Also during normal metering operations, the processor 25 may also obtain diagnostic test results data from the energy consumption circuit 17 and/or other circuits or devices within the meter 10. The diagnostic test results data may suitably be indicative of the general configuration of the meter 10 or related to the operational health or functionality of various devices or subsystems within the meter 10.

Further, during normal operations the processor 25 provides a switch control signal that cause the source switch 65 to disconnect the communication port 110 of the secondary communication circuit 50 from the DAA 70 and to connect the communication port 100 of the primary communication circuit 45 to the DAA 70.

From time to time during normal operations, the control circuit 30, and in particular the processor 25, causes the primary communication circuit to effectuate external communication of metering information or diagnostic test results. To this end, the processor 25 provides the metering information or diagnostic test results to the bus port 130. The primary communication circuit 45 then generates digital communication signals therefrom and provides the signals to the communication port 100. The digital communication signals propagate through the source switch 65 to the DAA 70. The DAA 70 then causes the signals to be communicated over the TIP and RING lines.

As discussed above in connection with FIG. 1, during normal metering operations, the various devices of the meter 10 obtain primary bias power from the primary power supply 35. To this end, the primary power supply 35 converts primary electrical power received from the φC power line to primary bias power in the form of DC voltage. In the exemplary embodiment described herein, the primary power supply 35 generates a regulated output voltage of approximately 5.7 volts DC at its output 35b. The regulated output voltage is reduced by the first protection diode 46 to approximately 5.0 volts and by the second protection diodes to approximately 4.3 volts.

In either the 5.0 or 4.3 volt form, the regulated output voltage provides primary bias power to the processor 25, the EEPROM 27, the primary communication circuit 45, and the energy consumption circuit 17. Moreover, the regulated output voltage charges the capacitor 52 to approximately 5.0 volts DC.

The power failure detection circuit 60 also receives the 5.0 volt regulated output voltage from the primary power supply output 35b and provides to the processor 25 a power failure detection signal indicative of the presence of primary electrical power to the power supply 35. In other words, in the absence of an interruption in the primary electrical power, the power failure detection circuit 60 provides a power fail signal to the processor 25 that indicates that the primary power supply 35 is generating an adequate bias voltage. Such a power fail signal could, for example, be a logical high signal. Further detail regarding the operation of an exemplary power failure detection circuit 60 is provided below in connection with FIG. 3.

In the event of an interruption in the primary electrical power to the primary power supply 35, or in other words, if there is a power outage on at least the power line φC, then the voltage level at the primary power supply output 35b of the power supply 35 begins to drop. In response to the drop in the voltage level at the primary power supply output 35b, the power failure detection circuit 60 provides a power failure signal to the I/O 39 of the processor 25 indicative of the interruption of the primary electrical power. As the bias voltage at the output 35b drops below the voltage at the capacitor 52, the capacitor 52 begins to discharge, thereby temporarily providing bias power to the energy consumption circuit 17, the processor 25 (through both the first and second bias connections 42 and 42a, respectively), the EEPROM 27, and the primary communication circuit 45.

At about the same time, the processor 25 receives the power failure signal via the I/O 39 and performs certain transitional operation to put the meter 10 into a low power mode of operation in response thereto. Further detail regarding the operations of the processor 25 upon detection of a power interruption is provided below in connection with FIGS. 5A and 5B. However, such transitional operations include providing a switch control signal to the source switch 65 to cause the communication port 110 to be coupled to the DAA 70 and to cause the communication port 100 to be decoupled from the DAA 70.

In general, however, after the transitional operations (see FIG. 5A steps 430 through 460), the meter 10 operates in the low power mode. In the low power mode, the secondary power supply 40 provides the secondary bias power through the third protection diode 54 to both the processor 25 and the secondary communication circuit 50. However, it will be appreciated that in alternative embodiments, the secondary bias power may be provided to the primary communication circuit 45 to allow limited communications. In the exemplary embodiment described herein, the second protection diode 48 prevents energy consumption circuit 17 and the non-volatile memory 27 from receiving secondary bias power and thus loading down the secondary power supply 40.

Further, as discussed below in connection with FIGS. 5A and 5B, the processor 25 uses the secondary communication circuit and the DAA 70 to effect communications with a remote device when the meter 10 is in the low power mode.

When the primary electrical power to the meter 10 is restored, the primary power supply 35 again produces the DC bias voltage of approximately 5.7 volts at the primary power supply output 35b. The DC bias voltage from the primary power supply 35 then provides a voltage high enough to reverse bias the third protection diode 54. As a result, the secondary bias power generated by the secondary power supply 40 does not propagate through the third protection diode 54, thereby effectively eliminating the power demands on the secondary power supply 40.

As the of the primary bias power voltage level increases, the power failure detection circuit 60 provides a power failure signal indicative of the presence of primary electrical power to the I/O 39. The processor 25 obtains the power failure signal indicative of the presence of primary electrical power, or in other words, indicative of the end of the power interruption, and restores the meter 10 to normal metering operations, described above.

Moreover, the primary bias voltage produced by the primary power supply 35 again provides power to the energy consumption circuit 17, the processor 25, the EEPROM 27, and the primary communication circuit 45.

Figure 3:
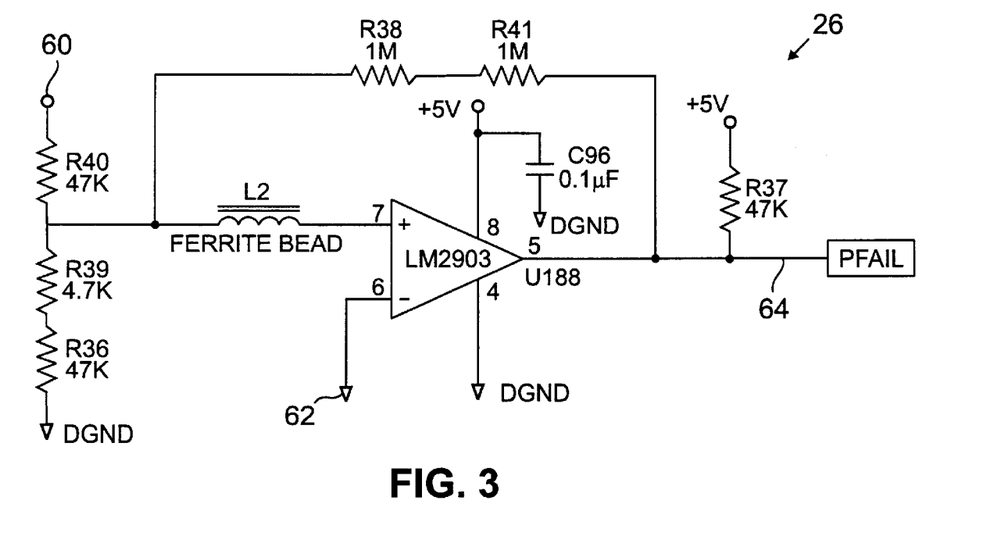
FIG. 3 shows an electrical schematic diagram of an exemplary power failure detection circuit for use in the meter of FIG. 2.

FIG. 3 shows an exemplary embodiment of the power failure detection circuit 60 of FIG. 2. In general, the power failure detection circuit includes a comparator, or operation amplifier U188, having a first differential input connected through a ferrite bead L2 to a voltage divider formed by an input resistor R40 and two dividing resistors R36 and R38. A second differential input of the operational amplifier U188 is coupled to a reference voltage input 62. A pair of feedback resistors R38 and R41 connect the power failure detection output 64 of the operational amplifier U188 to the first differential input. An power failure detection input 60 to the voltage divider is connected to the input resistor R40.

The power failure detection input 60 is preferably coupled to the primary power supply output 35b (shown in FIG. 2) through the first protection diode 46, which reduces the voltage at the power failure detection input 60 to 5.0 volts during normal operation. The reference voltage input 62 is preferably coupled to a source of 2.5 volts that can remain stable (at least temporarily) upon an interruption of primary electrical power to the primary power supply 35 of FIG. 2. For example, the output of the capacitor 52 of FIG. 2 may suitably be configured to provide a stable 2.5 volt stable reference point.

Referring again to FIG. 3, when the input voltage at the power failure detection input 60 is approximately 5 volts, the voltage divider formed by the resistors R36, R39 and R40 produce a divided voltage slightly in excess of the reference voltage. To this end, the input resistor R40 may suitable have a resistance of 47KΩ while the dividing resistors R36 and R39 have a combined resistance of 51.7KΩ. Thus, the voltage on the first differential input of the operational amplifier U188 exceeds the 2.5 reference voltage that is present on the second differential input of the operation amplifier U188. As a result, the operational amplifier provides approximately 5 volts high logic output at its power failure detection output 64. Accordingly, the power failure detection circuit 60 of FIG. 3 provides a logic high voltage when the primary electrical power is not interrupted.

The voltage at the power failure detection input 60 drops upon an interruption of the primary electrical power to the power supply 35 of FIG. 2. Once the voltage drops below a certain point, approximately 4.7 volts in the preferred embodiment described herein, the voltage produced by the voltage divider at the first differential input of the operational amplifier U188 will fall below 2.5 volts. As a result, the 2.5 volt reference voltage on the second differential input will exceed the voltage on the first differential input of the operation amplifier U188. Accordingly, the voltage at the power failure detection output 64 will drop to approximately zero, or a low logic voltage. Thus, the power failure detection circuit 60 provides a low logic voltage or approximately zero volts when the primary electrical power to the power supply 35 of FIG. 2 is interrupted.

The feedback resistors R38 and R41 provide some hysteresis such that the threshold to change the power failure signal from the low logic level to the high logic level is slightly higher than the threshold to change the power failure signal from the high logic level to the low logic level. Moreover, the ferrite bead L2 prevents spurious transients from changing the state of the power failure signal. The hysteresis and the ferrite bead L2 help inhibit false or spurious state changes in the power failure signal generated by the power failure detection circuit 60.

It is noted that the power failure detection circuit in FIG. 3 is given by way of example only, and that those of ordinary skill in the art may readily devise other implementations of a circuit that detects an interruption of primary electrical power provided to the power supply 35 of FIG. 2. For example, one alternative implementation would detect a drop in voltage directly from one of the power lines φA, φB, or φC.

Figure 4:
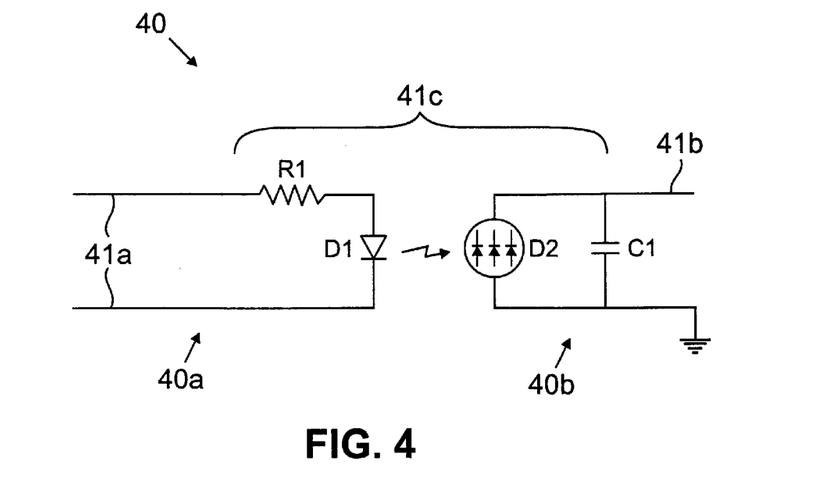
FIG. 4 shows an electrical schematic diagram of an exemplary embodiment of a secondary power supply for use in the meter of FIG. 2.

FIG. 4 shows an exemplary embodiment of a secondary power supply 40 for the meter of FIG. 2. Referring to FIG. 4, the power converter 41c of the secondary power supply 40 preferably comprises a photoelectric power circuit that includes a primary circuit 40a and a secondary circuit 40b. In general, the primary circuit 40a includes a photoemitter D1 that is operable to obtain electrical power and convert the electrical power to optical energy. The secondary circuit 40b includes at least one photosensitive device D2 that receives the optical energy. The secondary circuit 40b is operable to convert the received optical energy into secondary bias power.

In particular, the primary circuit 40a is comprised of a current limiting resistor RI and a photoemitter D1 which are operably coupled in series between the TIP and RING lines of a PSTN ("telephone lines") through the power supply input 41a. Accordingly, the primary circuit 40a is operably coupled to obtain electrical power from the PSTN. The photoemitter D1 is operable to convert that electrical power into a primary optical power. The current limiting resistor R1 suitably limits the current drawn from the telephones lines.

In the exemplary embodiment shown in FIG. 4, the current limiting resistor R1 is 8260 ohms and the photoemitter D1 is a light emitting diode ("LED") having a voltage drop of approximately 0.5 volts. Accordingly, the current drawn from the telephone lines is effectively on the order of 5 milliamps. However, it is noted that the value of the current limiting resistor R1 shown in FIG. 4 is merely exemplary. One of ordinary skill in the art may readily alter the value of R1 to change the amount of current drawn from the telephone lines as is suitable. Also, the use of an LED as the photoemitter D1 is merely exemplary, and one of ordinary skill in the art may readily devise another suitable way to convert the electrical power from the telephone lines into the primary optical power. For example, the photoemitter suitably may be one or more incandescent light sources, multiple LEDs, or both.

Furthermore, the resistor R1 and the photoemitter D1 may suitably be integrated or combined into a single element. For example, a filament type incandescent light bulb would have both a resistance and a photoemissivity that would provide both the current limiting function of the current limiting resistor R1 and the photoemission function of the photoemitter D1.

Referring again to FIG. 4, the secondary circuit 40b is comprised of a photosensitive device D2 which is operably coupled in parallel with an energy reservoir C1. In the exemplary embodiment shown, the photosensitive device D2 is a solar cell array of approximately ten serially connected solar cells which are configured to provide a secondary bias power at a suitable output voltage when illuminated (in this case, approximately 4 to 5 volts).

It is noted that the solar cell array provides voltage regulation for the secondary bias voltage due to the bias turn-on voltage of the individual solar cells. It will be noted that the solar cell array may suitably be replaced by other photovoltaic devices, some of which may require separate voltage regulation, such as a zener diode.

The exemplary energy reservoir C1 shown in FIG. 4 is a low leakage type capacitor, often referred to in the art as a super capacitor. It is noted, however, any other suitable energy storage device may be used. For example, the energy reservoir C1 suitably may be implemented as a rechargeable battery. The energy reservoir C1 allows the secondary power source 40 to provide relatively large amounts of power (exceeding that of the input power to the secondary power source 40) for short periods of time. While such draws on the secondary power source 40 can drain the charge from the energy reservoir C1, the delivery of power by the photoemitter D1 and the photosensitive device D2 serves to recharge the energy reservoir C1 during low or non-usage times.

Referring again to FIG. 4, in operation of the secondary power supply 40, the primary circuit 40a obtains the secondary electrical power (see FIG. 2) from the telephone lines via the input 41a. The primary circuit 40a converts the secondary electrical power (see FIG. 2) into the primary optical energy. Further, the secondary circuit 40b receives the primary optical energy. To this end, the photoemitter D1 of the primary circuit 40a is optically coupled to the photosensitive device D2 of the secondary circuit 40b.

The photosensitive device D2 converts the optical energy into an electrical energy. The electrical energy is then stored in the energy reservoir C1 and then provided as secondary bias power at the output 41b.

It will be appreciated that the primary circuit 40a is electrically isolated from the secondary circuit 40b. In other words, there is a high voltage isolation barrier between the primary circuit 40a and the secondary circuit 40b because they are not electrically connected to each other. When the meter 10 of FIG. 2 does not require consumption of the secondary bias power, the super capacitor C1 of the secondary circuit 40b stores the secondary bias power produced by the photosensitive device D2.

Figure 5A:
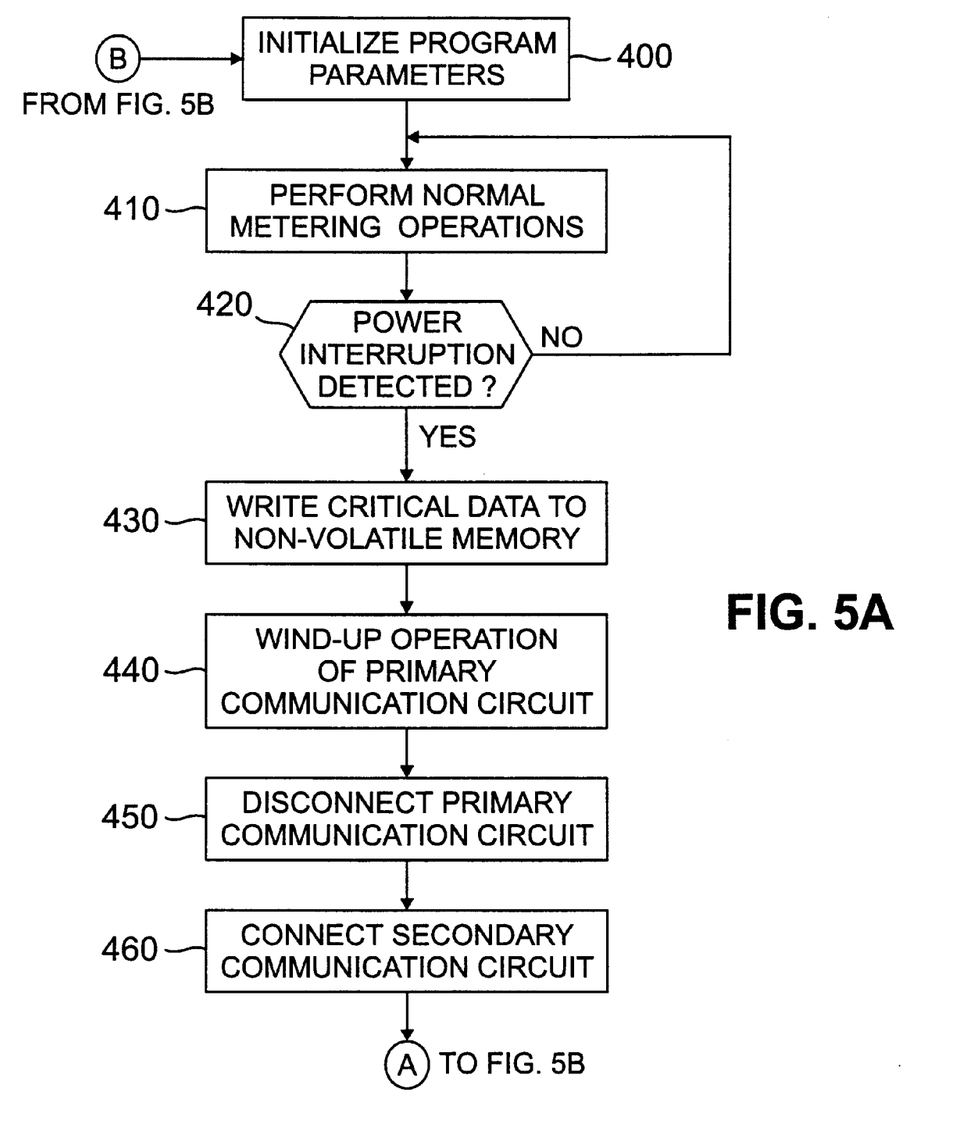
FIGS. 5A and 5B show a flow diagram of exemplary control logic for use in the meter of FIG. 2.
Figure 5B:
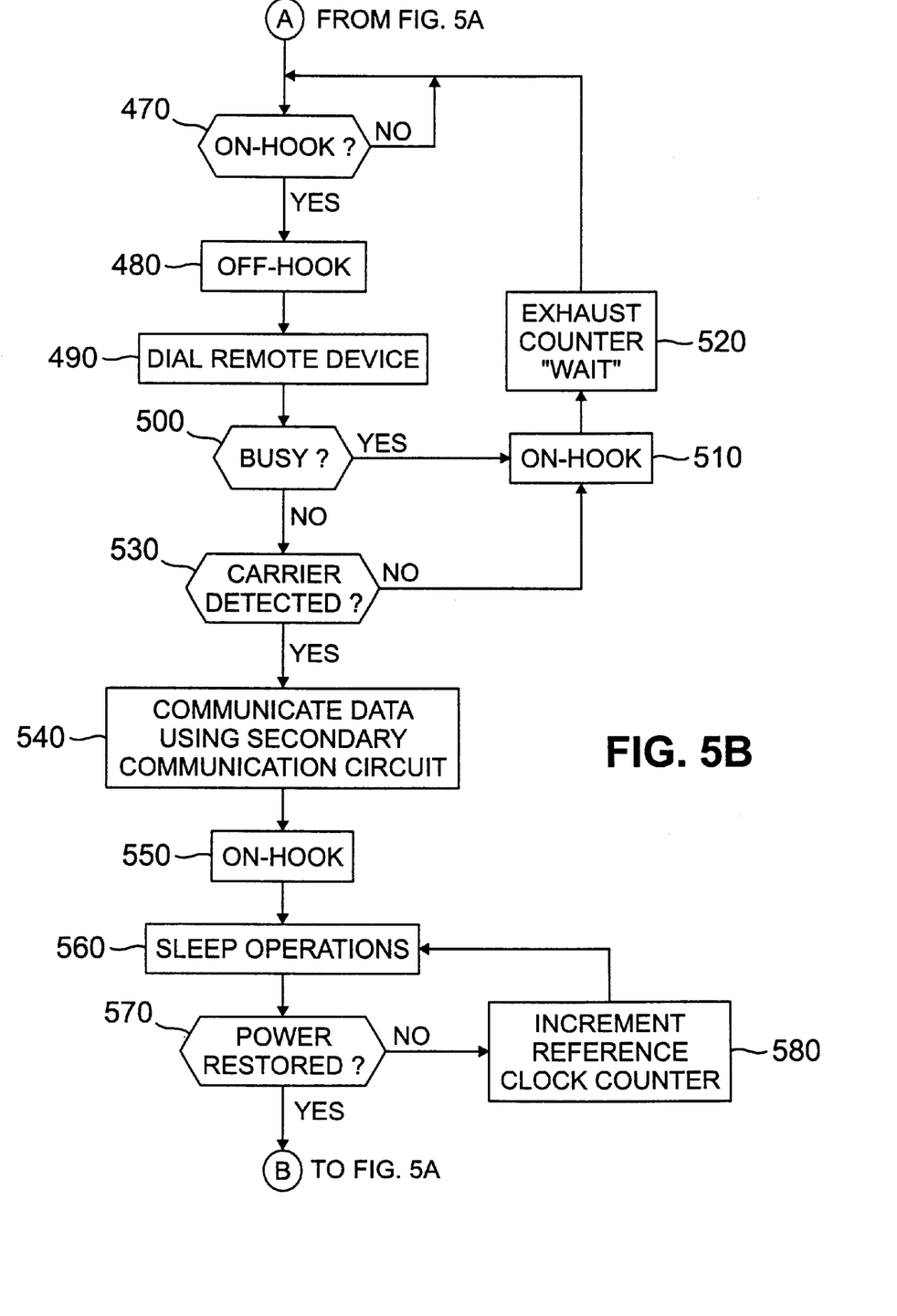

FIGS. 5A and 5B show a flow diagram of an exemplary set of operations for the processor 25 shown in FIG. 2. The operations shown in FIGS. 5A and 5B and described below may suitably be executed by the processor 25 of FIG. 2. It is noted that the order in which the operations are illustrated and described herein is merely exemplary, and one of ordinary skill in the art may readily devise a way to perform the operations in a different order which does not depart from the scope of the present invention.

Referring to FIG. 5A, step 400 is executed upon power-up of the processor 25 when primary electrical power is present. The power-up may occur when the meter 10 is first connected to the power lines φA, φB, φC, and N, or when the primary electrical power is restored after an interruption thereto. In step 400, the processor 25 initializes program parameters (including counters and timers, etc.) and performs other start-up operations, as would be well known in the art, and then proceeds to step 410.

In step 410, the processor 25 causes the meter 10 to perform normal metering operations and then proceeds to step 420. The illustration of the normal metering operations of the meter 10, such as those that relate to performing metering calculations and diagnostics as discussed above, is highly generalized and is only illustrated to place the operations relating to an interruption in the primary electrical power into context. As discussed above, in normal operations the processor 25 receives the energy consumption data and generates metering information therefrom. To this end, the processor 25 may convert the energy consumption data to standardized units for storage, display, and/or communication to a remote device. Such operations are well known.

Further, in normal operations the processor 25 directs the source switch 65, via the switch control signal 67, to couple the primary communication circuit 45 to the TIP and RFNG lines through the DAA 70 and to decouple the secondary communication circuit 50 from the TIP and RING line through the DAA 70.

In normal operations, the processor 25 further provides at least some of the metering information to a remote device by effectuating communications to the remote device via the primary communication circuit 45 and the DAA 70. It is noted that the meter 10 may suitably perform several other functions during normal metering operations which are not central to the operation of the present invention, and are therefore omitted for purposes of clarity of exposition.

In step 420, the processor 25 determines whether the primary electrical power is interrupted. To this end, the processor 25 examines the power failure signal from the power failure detection circuit 60 and determines whether the power failure signal indicates that the primary electrical power is interrupted. It is noted that the implementation of interrupts within a processor is well known, and that one of ordinary skill in the art may readily devise a suitable way to implement step 420 as an interrupt to step 410 upon the indication of an interruption in the primary electrical power by the power failure detection circuit 60. Accordingly, any of the other steps described herein may be implemented as interrupts as is suitable.

If, in step 420, the processor 25 determines that the primary electrical power has been interrupted, then the processor 25 proceeds to execute step 430. If not, however, then the processor 25 returns to step 410 (normal operations).

In step 430, the processor 25 transfers the critical data to the EEPROM 27, then proceeds to step 440. More particularly, certain of the metering data must be preserved through the power outage and even in the event that the secondary power supply and other back-up power supplies fail. The critical data often will include the accumulated watt-hr consumption information as well as time stamp information. In any event, the processor 25 transfers such information from its internal registers, or from other registers or the RAM 36 to the EEPROM 27.

In step 440, the processor 25 winds-up any communications which may have been in progress via the primary communication circuit 45 when the interruption in the primary electrical power occurred, then proceeds to step 450. More particularly, the wind-up may preferably consist of a graceful shutdown of the primary communications circuit 45. More particularly, it may include the completion of in-progress communications rather than an abrupt termination of communications mid-stream so as to avoid incomplete data transfers and/or transmission errors which could cause problems in the subsequent operations of the remote device and/or the meter 10.

In step 450, the processor 25 provides the switch control signal that causes the source switch 65 to disconnect the communication port 100 of the primary communication circuit 45 from the DAA 70. The processor 25 then proceeds to step 460.

In step 460, the processor 25 provides the switch control signal that causes the source switch 65 to connect the communication port 110 of the secondary communication circuit 50 to the DAA 70. The processor 25 then proceeds to step 470 of FIG. 5B. It will be noted that steps 450 and 460 may be accomplished contemporaneously by the same action by causing the DAA 70 to switch from being connected to the communication port 100 to being connected to the communication port 110.

Generally, steps 470–580 of FIG. 5B represent low power mode operations of the processor 25. In the embodiment described herein, the low power mode operations include communication of a meter identification number for the meter 10 to a remote device via the secondary communication circuit 50 and the DAA 70. Preferably, the remote device interprets its reception of the meter identification number as an indication that the primary electrical power to the meter 10 has been interrupted. A person or apparatus located at a facility containing the remote device may then determine what, if any action should be taken. For example, an attendant at the facility may elect to dispatch a technician to investigate the cause of the power failure and/or to effect repairs. In any event, it is noted that communication of the meter identification number is merely exemplary, and that the processor 25 may suitably cause the communication of other information to the remote device via the secondary communication circuit 50 and the DAA 70 as is well known in the art.

In step 470, the processor 25 reads signals present on the DAA control data port 72, which are available through the I/O 39, and determines whether the TIP and RING lines of the PSTN ("the telephone lines") are in an on-hook condition as is well known in the art.

If the processor 25 determines that the telephone lines are on-hook, then the processor 25 causes the meter 10 to proceed to step 480. If not, however, then the processor 25 repeats step 470 until it detects an on-hook condition. In this manner, the processor 25 does not attempt to communicate over telephone lines that are in use.

In step 480, the processor 25, via the DAA control data port 72, causes the DAA 70 to put the telephone lines into an off-hook condition as is well known in the art. The processor 25 then, in step 490, controls the operations of the secondary communication circuit 50 and the DAA 70 to transmit or dial a DTMF signal sequence representing a telephone number associated with the remote device. As a result, the meter 10 effectively places a call to the remote device.

Thereafter, in step 500, the processor 25 uses the DAA 70 to determine whether a busy signal is presented by the PSTN in response to the number dialed in step 490. If the processor 25 determines that a busy signal is present, then the processor 25 proceeds to step 510. If, however, the processor determines that a busy signal is not present, then the processor 25 proceeds to step 530 (carrier determination).

In step 510, the processor 25 uses the DAA 70 to return the telephone lines to an on-hook condition, and then proceeds to step 520. In step 520, the processor 25 sets a timer WAIT with a random number of counts representing a real time between 0 seconds minimum and thirty seconds maximum based on the clock speed, decrements WAIT until the random time expires, and then proceeds back to step 470 (on-hook determination).

In step 530, the processor 25 uses the DAA 70 to determine whether a carrier signal or dial tone is presented by the PSTN in response to the number dialed in step 490, as is well known. If the processor 25 determines that a carrier signal is present, then the processor 25 proceeds to step 540 (dial meter id). If not, then the processor 25 proceeds to step 510.

In step 540, the processor 25 further controls the operations of the secondary communication circuit 50 and the DAA 70 to transmit or dial a DTMF signal sequence representing a particular meter identification number, such as, for example, "1234". Thereafter, the processor 25 proceeds to step 550 (on-hook setting). It is noted that the particular meter identification number given is merely exemplary, and those of ordinary skill in the art may readily configure the present invention to transmit any suitable number sequence (including any suitable number of digits).

In step 550, the processor 25 uses the DAA 70 to put the telephone lines into an on-hook condition, and then proceeds to step 560. In step 560, the processor 25 causes the meter 10 to perform sleep operations, consistent with those discussed above in connection with FIG. 2.

It is noted that the sleep operations of step 560 may include, among other things, maintaining a reference clock, particularly if the meter 10 is used as a time-of-use meter. In such a meter, a clock is maintained during a power interruption in order to ensure that the real-time clock accurately reflects the time of day (and date) after power is restored. The reference clock may simply be a software counter maintained by the CPU 32 to track the duration of the power interruption. Also, as part of the sleep operations, the processor 25 periodically determines if primary power has been restored.

To this end, the processor 25 is programmed to executed an interrupt timer that upon expiration, proceeds to step 570. Until the interrupt time expires, however, the processor 25 does not perform any operations, thereby conserving power.

In step 570, the processor 25 determines if primary power has been restored. In particular, the processor 25 in step 570 determines whether power is restored by polling the power fail signal provided by the power failure detection circuit 60. If, based on the status of the power fail signal the processor 25 determines that primary electrical power has been restored, then the processor 25 proceeds back to step 400 (initialization). Otherwise, the processor 25 proceeds to step 580 to increment the reference clock counter. After step 580, the processor 25 returns to step 560 and resets the interrupt timer.

As can be seen, the above exemplary embodiment thus benefits from the advantages of using different communication circuits depending on whether there is an interruption of primary electrical power. Namely, the use of such different communication circuits allows the meter 10 to effectuate at least rudimentary communications during a power interruption without unduly loading the secondary power supply.

Moreover, the above described embodiment further benefits from the use of a power supply that derives electrical power from an external communication network. By using the electrical power from an external communication network, the drawbacks associated with long term power interruptions, namely, the permanent discharge of the battery and consequent loss of data, are greatly reduced or eliminated.

Finally, the above described embodiment further benefits from the use of optical isolation in the secondary power supply 40 to achieve isolation between the source of power (e.g. the PSTN) and the meter 10, without introducing bulky and expensive magnetics, as would be normally used in an isolation transformer. It is noted that the use of the photosensitive device D2 to convert optical energy into electrical energy facilitates the possibility of employing ambient environmental light as a secondary power source. In particular the ambient light would provide the optical energy from which the photosensitive device D2 generates the secondary bias voltage. In some situations, a combination of both energy transferred through the photoemitter D1 and ambient optical energy may be used as the secondary power source. Those of ordinary skill in the art may readily arrange the photosensitive device D2 to, or add additional photosensitive devices to, obtain optical power from ambient environmental light that is present in the vicinity of the meter 10.

It is noted that the embodiments described in the foregoing description are merely exemplary, and that those of ordinary skill in the art may readily devise their own implementations that incorporate the principals of the present invention and fall within the spirit and scope thereof. For example, while the disclosed arrangement provides low power secondary communications for an electrical utility meter, such an arrangement may be readily modified by those of ordinary skill in the art for implementation in another utility meter that meters another commodity, such as a water or gas. The present invention is readily implemented in such a utility meter if the meter generates commodity consumption signals and uses electrical circuitry to generate metering information and/or communicate information to a remote device.

Furthermore, it is noted that alternative embodiments of the present invention may not include all of the features described herein yet still benefit from at least some of the advantages of the invention. Those of ordinary skill in the art may readily devise their own such implementations that incorporate one or more of the features of the present invention and fall within the spirit and scope thereof.

For example, it is noted that although the use of the photoelectric power circuit described in FIG. 4 as the power converter 41c of the secondary power supply 40 provides several advantages, at least some of the advantages of the present invention may be achieved through the use of alternative and more conventional circuits as the power converter 41c, especially if the conventional signal is configured to use energy from an external communication network. For example, the power converter 41c of the secondary power supply 40 suitably may be implemented as a normal voltage regulator circuit. However, because external networks typically require isolation, however, the power converter 41c preferably includes electrical isolation from the TIP and RING lines. To this end, the power converter 41c may comprise a switching DC-DC converter that converts electrical power at the DC voltage level of the telephone lines to the secondary bias power voltage level via a magnetic coupling. It will be noted that the current draw off of the PSTN should not exceed approximately five milliamps. Those of ordinary skill in the art would readily be able to implement a DC-DC converter that converts the ambient voltage of the PSTN TIP and RING lines to one or more regulated bias voltage levels.

It will furthermore be appreciated that while the exemplary embodiments described herein employ the PSTN as the external communication network, any communication network, especially communication networks that provide ambient electrical power during non-use, may readily be substituted for the PSTN.

We claim:

1. A communication system for a utility meter, the utility meter including a primary power supply operable to receive a primary electrical power from a primary power source and generate primary bias power therefrom, the communication system comprising:
   a) a primary communication circuit operable to effectuate external communications when said primary electrical power is received by the primary power supply of the utility meter; and
   b) a secondary communication circuit operable to effectuate external communications when said primary electrical power from the primary power source is interrupted.

2. The communication system of claim 1, wherein the secondary communication circuit is further operable to effectuate external communications when said primary electrical power from the primary power source is undergoing a power interruption.

3. The communication system of claim 1, wherein the primary communication circuit is operable to effectuate external communications only when said primary electrical power from the primary power source is received by the primary power supply of the utility meter.

4. The communication system of claim 1, wherein the secondary communication circuit includes a DTMF transmitter.

5. The communication system of claim 1, wherein the primary communication circuit includes a modem.

6. The communication system of claim 1 wherein the primary communication circuit is further operable to effectuate external communications when said primary electrical power is received by the primary power supply of the utility meter, the utility meter operable to measure electricity consumption.

7. The communication system of claim 1 wherein the primary communication circuit is further operable to effectuate external communications of metering information when said primary electrical power is received by the primary power supply of the utility meter.

8. The communication system of claim 1, further comprising a control circuit operable to:
   obtain information identifying an interruption of said primary electrical power from the primary power source; and
   enable operation of the secondary communication circuit responsive to obtaining said information.

9. The communication system of claim 8, wherein the control circuit includes a microprocessor.

10. The communication system of claim 8, wherein the control circuit is operable to cause the secondary communication circuit to effectuate communications to a remote device communicating information identifying the interruption of said primary electrical power.

11. The communication system of claim 8, wherein the control circuit includes a switch operably and alternatively connecting the primary communication circuit and the secondary communication circuit with an external communication network.

12. A utility meter having a communication system, comprising:
   a source of commodity consumption signals;
   a measurement circuit operable to generate metering data from the commodity consumption signals;
   a primary power supply operable to receive primary electrical power from a primary power source and generate primary bias power therefrom;
   a primary communication circuit operable to effectuate external communications when said primary electrical power from the primary power source is present; and
   a secondary communication circuit operable to effectuate external communications when said primary electrical power from the primary power source is interrupted.

13. The utility meter of claim 12, wherein the source of commodity consumption signals comprises a source of energy consumption information.

14. The utility meter of claim 13, wherein the secondary communication circuit is further operable to effectuate external communications when said primary electrical power from the primary power source is undergoing a power interruption.

15. The utility meter of claim 13, wherein the primary communication circuit is operable to effectuate external communications only when said primary electrical power from the primary power source is present.

16. The communication system of claim 13, wherein the secondary communication circuit includes a DTMF transmitter.

17. The utility meter of claim 13, wherein the primary communication circuit includes a modem.

18. The utility meter of claim 13, further comprising a control circuit operable to:
   obtain information identifying an interruption of said primary electrical power from the primary power source; and
   enable operation of the secondary communication circuit responsive to said information.

19. The utility meter of claim 18, wherein the control circuit includes a microprocessor.

20. The utility meter of claim 18, wherein the control circuit is operable to cause the secondary communication circuit to effectuate communications to a remote device communicating information identifying the interruption of said primary electrical power.

21. The utility meter of claim 18, wherein the control circuit includes a switch operably and alternatively connecting the primary communication circuit and the secondary communication circuit with an external communication network.

22. A power disturbance communication method for a utility meter, the utility meter including a primary communication circuit for effecting external communication, the primary communication circuit operably connected to receive primary bias power from a primary power supply, the primary power supply having an arrangement for obtaining a primary electrical power from a primary power source, the power disturbance communication method comprising the steps of:

a) detecting an interruption in the primary electrical power from the primary power source;

b) reducing an amount of operation of the primary communication circuit of the utility meter when the primary electrical power from the primary power source is interrupted; and c) increasing an amount of operation of a secondary communication circuit when the primary electrical power from the primary power source is interrupted.

23. The power disturbance communication method of claim 22, wherein step a) further comprises determining that a primary bias voltage of said primary bias power is below a predetermined threshold.

24. The power disturbance communication method of claim 22, wherein step b) further comprises preventing operation of the primary communication circuit.

25. The power disturbance communication method of claim 22, wherein step b) further comprises reducing an amount of operation of the primary communication circuit of the utility meter when the primary electrical power from the primary power source is interrupted, the utility meter operable to generate electricity consumption information.

26. The power disturbance communication method of claim 22, wherein step c) further comprises increasing an amount of operation of the secondary communication circuit when the primary electrical power from the primary power source is interrupted, the secondary communication circuit included in the utility meter.

* * * * *